(12) United States Patent
Okushima

(10) Patent No.: US 8,194,369 B2
(45) Date of Patent: Jun. 5, 2012

(54) SEMICONDUCTOR INTEGRATED CIRCUIT

(75) Inventor: Mototsugu Okushima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 476 days.

(21) Appl. No.: 12/289,904

(22) Filed: Nov. 6, 2008

(65) Prior Publication Data

US 2009/0122452 A1    May 14, 2009

(30) Foreign Application Priority Data

Nov. 12, 2007    (JP) .................. 2007-293233

(51) Int. Cl.
 *H02H 9/00*    (2006.01)
(52) U.S. Cl. ........ 361/56; 361/91.1; 361/91.2; 361/111; 361/91.5
(58) Field of Classification Search .............. 361/56, 361/91.1, 91.2, 111, 91.5
See application file for complete search history.

(56) References Cited

U.S. PATENT DOCUMENTS

| | | | |
|---|---|---|---|
| 7,233,467 | B2 | 6/2007 | Mergens et al. |
| 7,245,466 | B2 * | 7/2007 | Steinhoff ................... 361/56 |
| 7,256,976 | B2 | 8/2007 | Sato |
| 2003/0214773 | A1 * | 11/2003 | Kitagawa ................... 361/118 |
| 2004/0141269 | A1 * | 7/2004 | Kitagawa ................... 361/56 |
| 2005/0264963 | A1 * | 12/2005 | Sato ........................... 361/56 |
| 2005/0286188 | A1 | 12/2005 | Camp et al. |
| 2006/0209478 | A1 * | 9/2006 | Arai et al. ................. 361/56 |
| 2006/0244071 | A1 * | 11/2006 | Kondo ....................... 257/355 |
| 2008/0013232 | A1 | 1/2008 | Sato |

FOREIGN PATENT DOCUMENTS

| | | |
|---|---|---|
| CN | 1702860 A | 11/2005 |
| CN | 1702860 A | 11/2005 |
| JP | 2005-340380 | 12/2005 |

OTHER PUBLICATIONS

Benjamin Van Camp, et al. "Current detection trigger scheme for SCR based ESD protection of Output drivers in CMOS technologies avoiding competitive triggering"(EOS/ESD Symposium, 2005).
Yasuyuki Morishita "A PNP-Triggered SCR with Improved Trigger Techniques for High-Speed I/O ESD Protection in Deep Sub-Micron CMOS LSIs" (EOS/ESD Symposium, 2005).
Chinese Office Action dated Dec. 6, 2010, with English translation.
Chinese Office Action dated Jul. 7, 2011, with English translation.

* cited by examiner

*Primary Examiner* — Patrick Salce
(74) *Attorney, Agent, or Firm* — McGinn IP Law Group, PLLC

(57) ABSTRACT

A semiconductor integrated circuit includes: an output pad from which an output signal is outputted; an output signal line connected with the output pad; a first pad configured to function as a ground terminal or a power supply terminal; a first wiring connected with the first pad; an output driver connected with the output pad and configured to generate the output signal; an ESD protection device connected with the output signal line and having a function to discharge surge applied to the output pad; and a first trigger MOS transistor used as a trigger device. The output driver includes: a first protection target device connected between the output signal line and the first interconnection; and a first resistance element connected between the first protection target device and the first interconnection. The first trigger MOS transistor configured to detect a voltage generated in the first resistance element by a gate of the first trigger MOS transistor and to allow the ESD protection device operate in response to the detected voltage.

10 Claims, 18 Drawing Sheets

SEMICONDUCTOR INTEGRATED CIRCUIT

INCORPORATION BY REFERENCE

This application claims a priority on convention based on Japanese Patent Application No. 2007-293233. The Disclosure thereof is incorporated herein by reference.

BACKGROUND OF THE INVENTION

1. Field of the Invention

The present invention relates to a semiconductor integrated circuit, and more particularly, to a semiconductor integrated circuit provided with an ESD (electrostatic discharge) protection device for preventing breakdown of an internal circuit due to application of an ESD surge.

2. Description of Related Art

A semiconductor integrated circuit is generally provided with an ESD protection device for protecting an internal circuit from ESD surge applied to an input/output pad. The ESD protection device discharges the ESD surge applied to the input/output pad to a power supply line or a ground line, thereby protecting the internal circuit.

A thyristor is a typical ESD protection device. Since the thyristor has high discharge capacity and can reduce a parasitic capacitance, it is used as the ESD protection device for high-speed interface. The semiconductor integrated circuit including the thyristor as the ESD protection device is disclosed in "A PNP-Triggered SCR with Improved Trigger Techniques for High-Speed I/O ESD Protection in Deep Sub-Micron CMOS LSIs" by Y. Morishita (EOS/ESD Symposium 2005). This document discloses an ESD protection circuit which uses an NMOS transistor having a gate connected to a gate bias circuit, as a trigger device of the thyristor. In addition, U.S. Pat. No. 7,233,467 discloses protection of an input circuit connected to an input pad. In detail, U.S. Pat. No. 7,233,467 discloses circuit topology in which a resistance element is connected between a source of the NMOS transistor of an input buffer and the ground line. In the semiconductor integrated circuit in this publication, by passing a current to the resistance element through the thyristor when the ESD surge is applied, the voltage of the source of the NMOS transistor in the input buffer is increased, thereby protecting the NMOS transistor against the ESD surge.

FIG. 1 is a circuit diagram showing an example of configuration of a semiconductor integrated circuit 100 using the thyristor as the ESD protection device. The semiconductor integrated circuit 100 has a VDD pad 111 connected to a power supply line 101, an output pad 112 connected to an output signal line 102 and a VSS pad 113 connected to a ground line 103. A last stage output driver 116 of an internal circuit 115 is connected to the output pad 112. The last stage output driver 116 is formed of a PMOS transistor P1 and an NMOS transistor N1. The internal circuit 115 further has a previous stage pre-driver 117 for driving a gate of the NMOS transistor N1. The previous stage pre-driver 117 is formed of a PMOS transistor P2 and an NMOS transistor N2.

A thyristor 114 is connected between the output pad 112 and the VSS pad 113 to function as the ESD protection device. When the ESD surge is applied to the output pad 112, the thyristor 114 discharges the ESD surge to the ground line 103 to protect the last stage output driver 116. Although the semiconductor integrated circuit shown in FIG. 1 is not provided with a trigger device, in many cases, the trigger device is connected to the thyristor used as the ESD protection device and the thyristor is triggered by the trigger device.

A problem caused by using the thyristor as the ESD protection device is difficulty in properly triggering the thyristor, in particular, in triggering the thyristor with a low voltage. This problem is serious, especially, if a gate of the NMOS transistor N1 of the last stage output driver 116 is in the floating state when the ESD surge is applied to the output pad 112. When the NMOS transistor N2 of the previous stage pre-driver 117 is in the off state, the gate of the NMOS transistor N1 is set to the floating state and current flows through the NMOS transistor N1. When excessive current flows through the NMOS transistor N1 before the thyristor 114 operates, the NMOS transistor N1 is subjected to breakdown.

A method for solving such a problem is that a surge current flowing through a device to be protected (hereinafter referred to as a "protection target device") is detected and the thyristor is operated in response to the detected surge current. By detecting the surge current flowing through the protection target device, and triggering and operating the thyristor according to the surge current before the protection target device is subjected to breakdown, the protection target device can be surely protected. Such a method is disclosed in "Current detection trigger scheme for SCR based ESD protection of Output drivers in CMOS technologies avoiding competitive triggering" by Benjamin Van Camp, et al. (EOS/ESD Symposium, 2005) and U.S. Patent Application Publication (2005/0286188).

FIG. 2 is a circuit diagram showing a configuration of a semiconductor integrated circuit configured to detect the current flowing through the protection target device and to trigger the thyristor. The semiconductor integrated circuit 200 has a thyristor 114, an output driver 116, a current detecting resistance element 118, diodes 119 and 120, an ESD clamp circuit 121, a power supply clamp circuit 122 and a diode 123. The semiconductor integrated circuit 200 shown in FIG. 2 is configured so that a current $I_{NMOS}$ flowing through the NMOS transistor N1 of the output driver 116 is detected by the current detecting resistance element 118 and the thyristor 114 is triggered in response to the detected current $I_{NMOS}$.

A problem of the semiconductor integrated circuit in FIG. 2 is that since an N gate Gn of the thyristor 114 is electrically connected to the output pad 112, an output capacitance of the output pad 112 increases. A configuration of the thyristor 114 contributes to the increase in the output capacitance. FIG. 3 is a sectional view showing the configuration of the thyristor 114. An N well 132 and a P well 133 are formed in a P-type substrate 131 to be adjacent to each other. An N$^+$ region 134 which function as the N gate Gn and a P$^+$ region 135 connected to the output pad 112 are formed in the N well 132. Here, the "N$^+$ region" refers to a region in which high-concentration n-type impurities are doped. The "P+ region" refers to a region in which high-concentration P-type impurities are doped. An N$^+$ region 136 connected to the ground line 103 and the P$^+$ region 137 which functions as a P gate Gp are formed in the P well 133. A P well 138 is formed in the P-type substrate 131, and a P$^+$ region 139 connected to the ground line 103 is formed in the P well 138. In FIG. 3, a capacitance of the PN junction between the N well 132 and the P$^+$ region 135 is shown as C1 and the capacitance of the PN junction between the N well 132 and the P well 133 is shown as C2.

As shown in FIGS. 4A and 4B, when the N gate Gn is connected to the output pad 112 (via the current detecting resistance element 118), an output capacitance $C_{total}$ substantially corresponds to a capacitance C2. Since it is difficult to reduce a junction area between the N well 132 and the P well 133, it is difficult to make the capacitance C2 smaller, which means that it is difficult to reduce the output capacitance $C_{total}$. Increase in an output capacitance of the output pad 112 is disadvantageous in outputting an output signal at high speed.

Japanese Patent Application Publication (JP-P2005-340380A) discloses circuit topology configured to detect a current flowing through a protection target device and trigger the thyristor while reducing the parasitic capacitance (output capacitance). FIG. 5 is a circuit diagram showing a configuration of a semiconductor integrated circuit 300 disclosed in this publication. The semiconductor integrated circuit 300 has a thyristor 114, an output driver 116, diodes 119 and 120, a resistance element 124 and a PMOS transistor 125 used as a trigger device. The output driver 116 is formed from the PMOS transistor P1 and the NMOS transistor N1, and the resistance element 124 is connected between the NMOS transistor N1 and the ground line 103. A gate of the PMOS transistor 125 is connected to the power supply line 101, a drain thereof is connected to the P gate Gp of the thyristor 114 and a source thereof is connected to a connection node VO between the NMOS transistor N1 and the resistance element 124.

An operation of the semiconductor integrated circuit 300 in FIG. 5 is substantially as follows. When ESD surge is applied to the output pad 112, a parasitic bipolar transistor of the NMOS transistor N1 is turned on through a snap-back operation, so that a current flows into the connection node VO between the NMOS transistor N1 and the resistance element 124. Thereby, a voltage of the connection node VO rapidly increases. When the voltage of the connection node VO increases and a gate-source voltage Vgs of the PMOS transistor 125 (gate voltage using source voltage as reference) becomes lower than a threshold voltage—Vth, the PMOS transistor 125 is turned on to supply a trigger to the thyristor 114.

With the circuit configuration shown in FIG. 5, since both of the N gate Gn and the P gate GP of the thyristor 114 are electrically isolated from the output pad 112, an output capacitance of the output pad 112 can be reduced.

However, the semiconductor integrated circuit 300 in FIG. 5 has a problem that decrease in the resistance value of a path to which an output signal is outputted and reliability in triggering of the thyristor 114 cannot be achieved at a time. To allow the parasitic bipolar transistor of the NMOS transistor N1 to be turned on through the snap-back operation, a voltage of about 5V is generally required. It is difficult to make the gate voltage of the PMOS transistor 125 lower than a source voltage through the snap-back operation. In addition, in the semiconductor integrated circuit 300 in FIG. 5, to reduce a loss in outputting the output signal, the resistance value of the resistance element 124 must be made small. However, when the resistance value of the resistance element 124 is made small, increase in the voltage of the connection node VO becomes moderate. As a result, even when the ESD surge is applied, the thyristor 114 is hard to operate.

Such a problem is applied to the semiconductor integrated circuit 200 in FIGS. 4A and 4B. To reduce the loss in outputting the output signal, the resistance value of the current detecting resistance 118 must be made small. However, when the resistance value of the current detecting resistance element 118 is made small, difference in voltage between an anode and the N gate Gn of the thyristor 114 becomes smaller so that the thyristor 114 is hard to operate.

SUMMARY

Such a problem is applied to the semiconductor integrated circuit 200 in FIGS. 4A and 4B. To reduce the loss in outputting the output signal, the resistance value of the current detecting resistance 118 must be made small. However, when the resistance value of the current detecting resistance element 118 is made small, difference in voltage between an anode and the N gate Gn of the thyristor 114 becomes smaller so that the thyristor 114 is hard to operate.

In an aspect of the present invention, a semiconductor integrated circuit includes: an output pad from which an output signal is outputted; an output signal line connected with the output pad; a first pad configured to function as a ground terminal or a power supply terminal; a first wiring connected with the first pad; an output driver connected with the output pad and configured to generate the output signal; an ESD protection device connected with the output signal line and having a function to discharge surge applied to the output pad; and a first trigger MOS transistor used as a trigger device. The output driver includes: a first protection target device connected between the output signal line and the first interconnection; and a first resistance element connected between the first protection target device and the first interconnection. The first trigger MOS transistor configured to detect a voltage generated in the first resistance element by a gate of the first trigger MOS transistor and to allow the ESD protection device operate in response to the detected voltage.

According to the present invention, it is possible to provide a semiconductor integrated circuit which can simultaneously achieve reduction in the resistance value of the path to which the output signal is outputted and reliability in triggering of the ESD protection device while having a low output capacitance.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a semiconductor integrated circuit 10 according to the present invention will be described with reference to the attached drawings.

[First Embodiment]

Figure 6A:
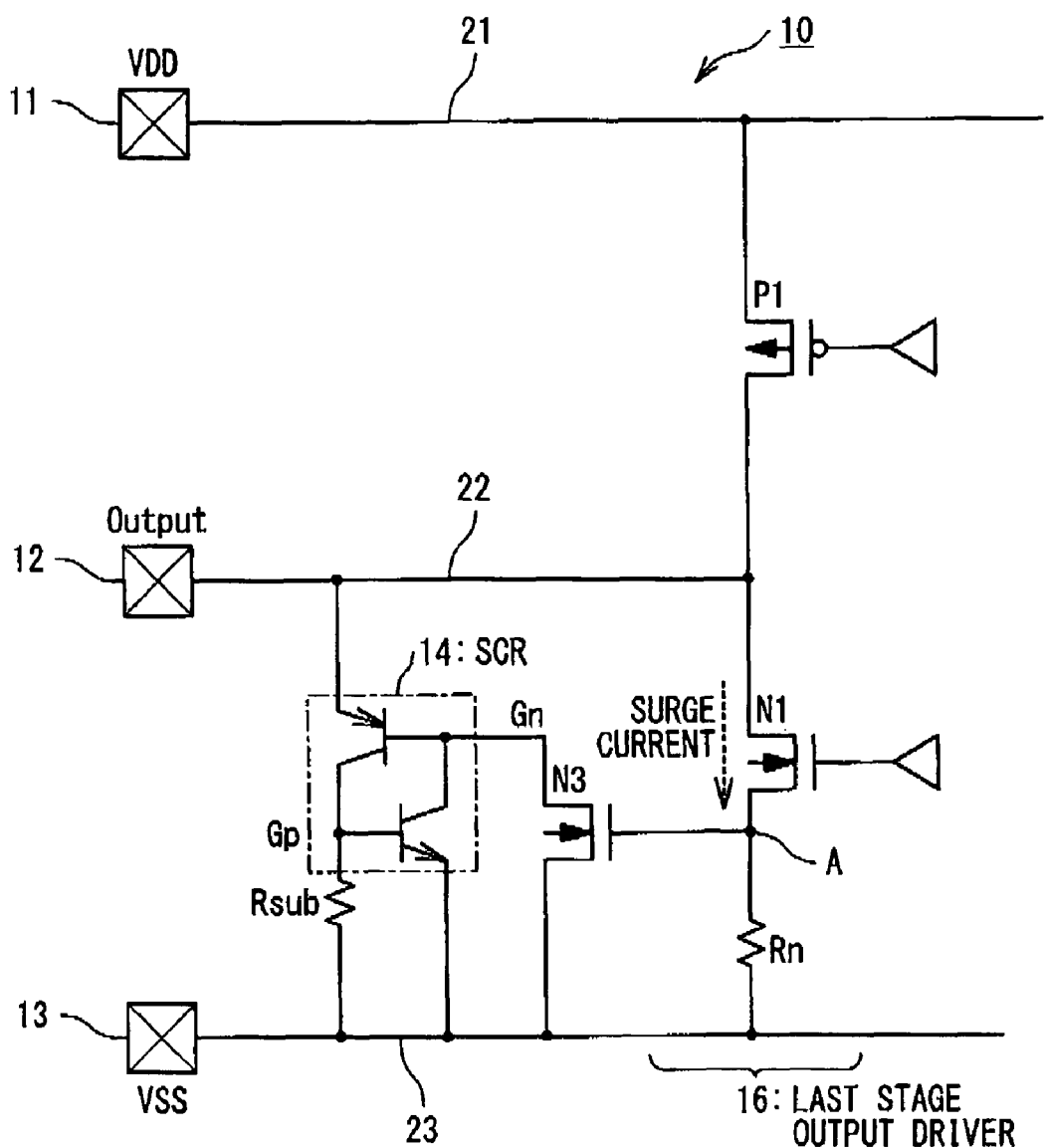
FIG. 6A is a circuit diagram showing a configuration of a semiconductor integrated circuit of a first embodiment of the present invention.

FIG. 6A is a circuit diagram showing a configuration of a semiconductor integrated circuit 10 according to a first embodiment of the present invention. The semiconductor integrated circuit 10 has a VDD pad 11 connected to a power supply line 21, an output pad 12 connected to an output signal line 22, a VSS pad 13 connected to a ground line 23 and a thyristor 14. The VDD pad 11 serves as a power supply terminal to which a power supply voltage is supplied, and the VSS pad 13 serves as a ground terminal to be grounded. The output pad 12 is used to output an output signal to an external unit. The thyristor 14 has a function of discharging ESD surge to the ground line 23 when the ESD surge is applied to the output pad 12.

A last stage output driver 16 of an internal circuit is connected to the output signal line 22. The last stage output driver 16 has a PMOS transistor P1 connected between the power supply line 21 and the output signal line 22 and an NMOS transistor N1 connected between the ground line 23 and the output signal line 22. The PMOS transistor P1 is connected to the power supply line 21 at its source and connected to the output signal line 22 at its drain. The NMOS transistor N1 is connected to the output signal line 22 at its drain and connected to a node A at its source. In an ordinary operation, an output signal generated by the last stage output driver 16 is supplied to the output pad 12 via the output signal line 22 and outputted from the output pad 12 to the external unit. As described later, in the present embodiment, the NMOS transistor N1 of the last stage output driver 16 is a protection target device.

Figure 1:
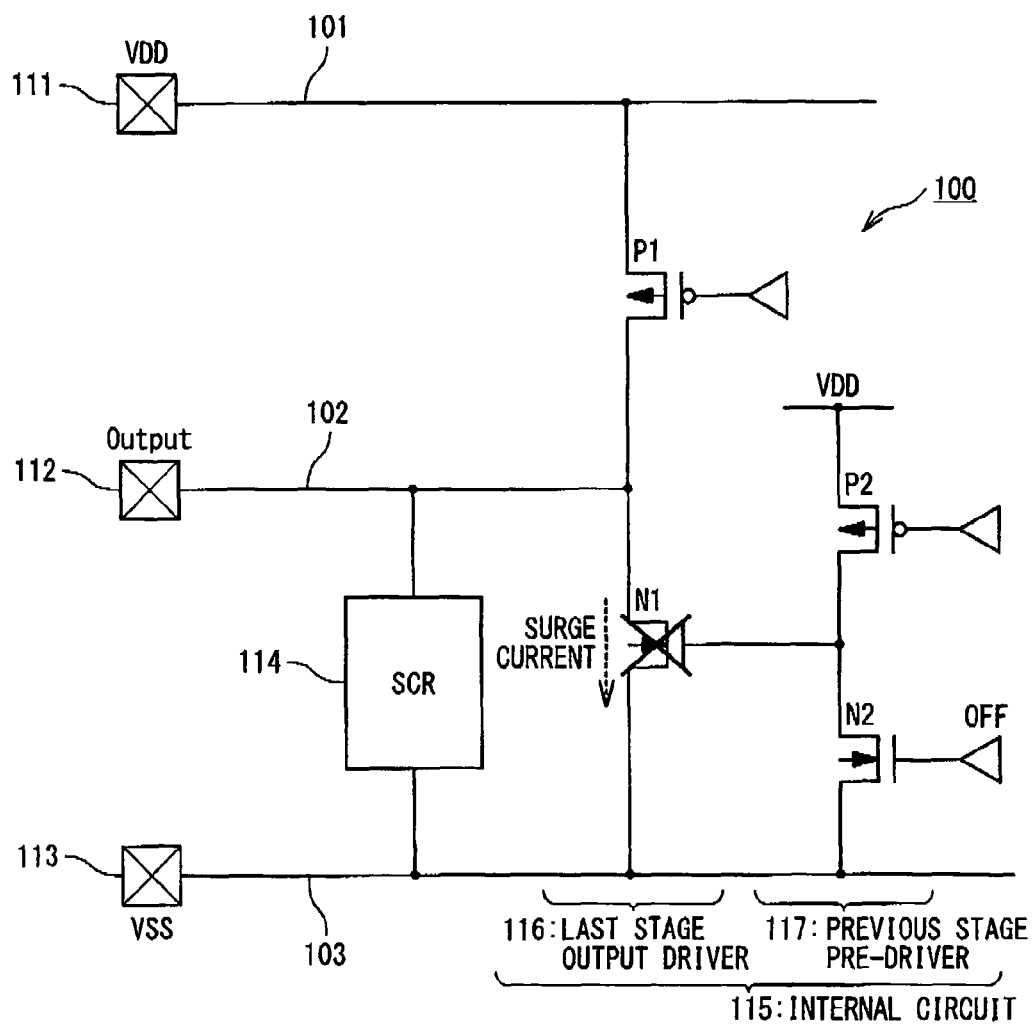
FIG. 1 is a circuit diagram showing a configuration of a conventional semiconductor integrated circuit including a thyristor as an ESD protection device.
Figure 2:
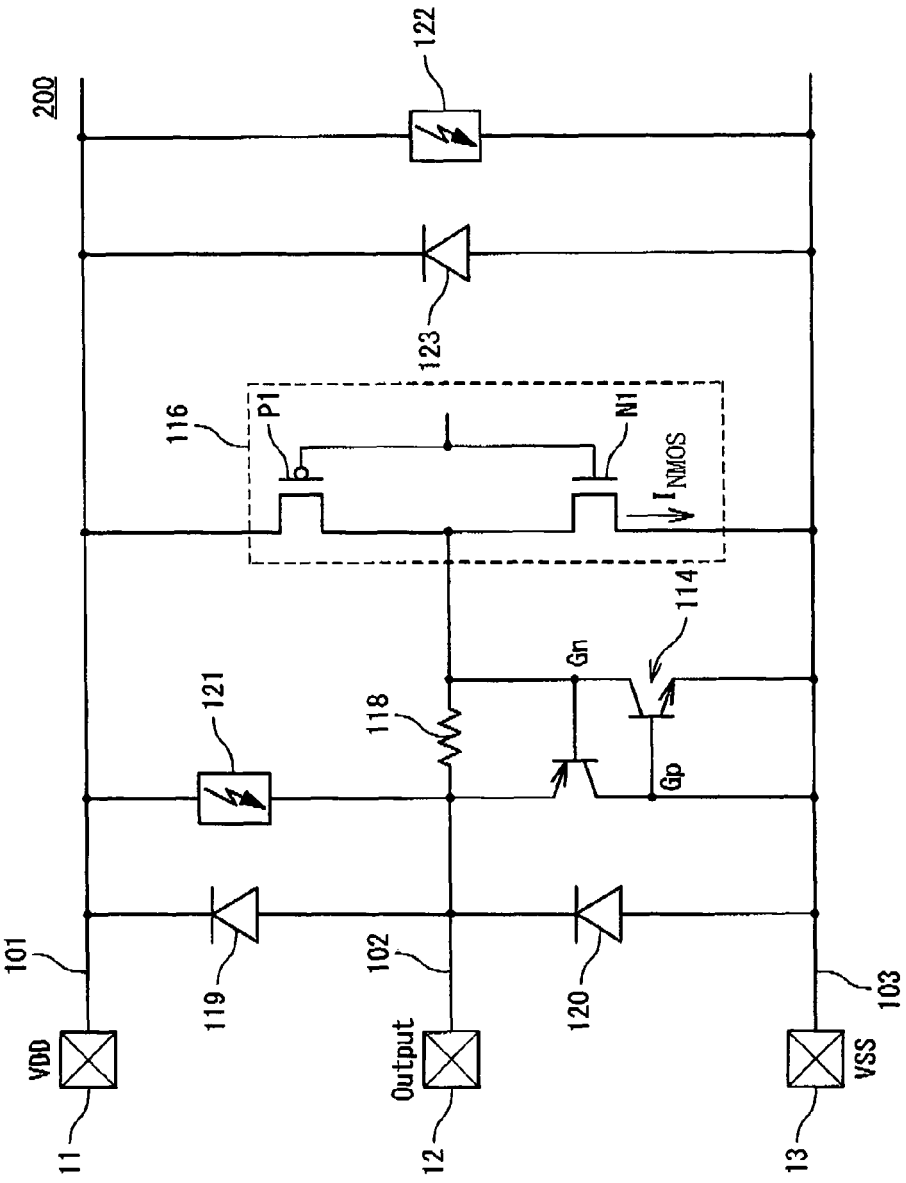
FIG. 2 is a circuit diagram showing a configuration of another conventional semiconductor integrated circuit including a thyristor as the ESD protection device.
Figure 3:
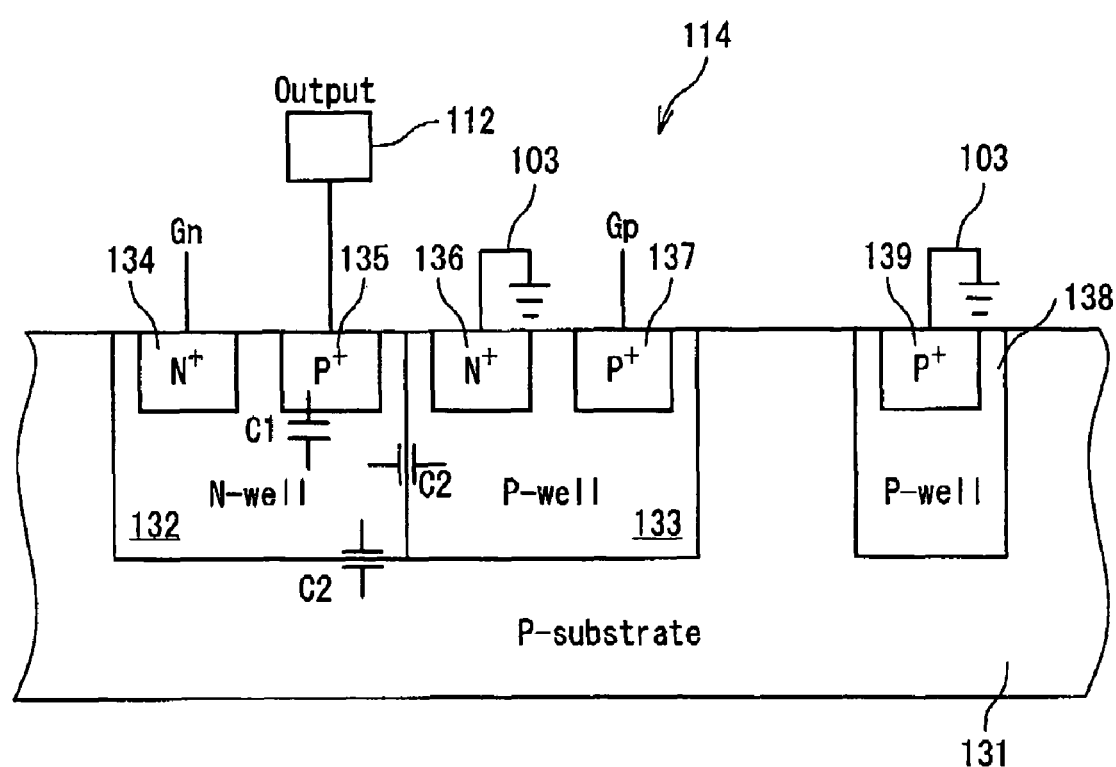
FIG. 3 is a sectional view showing a configuration of the thyristor shown in FIG. 2.
Figures 4A, 4B:
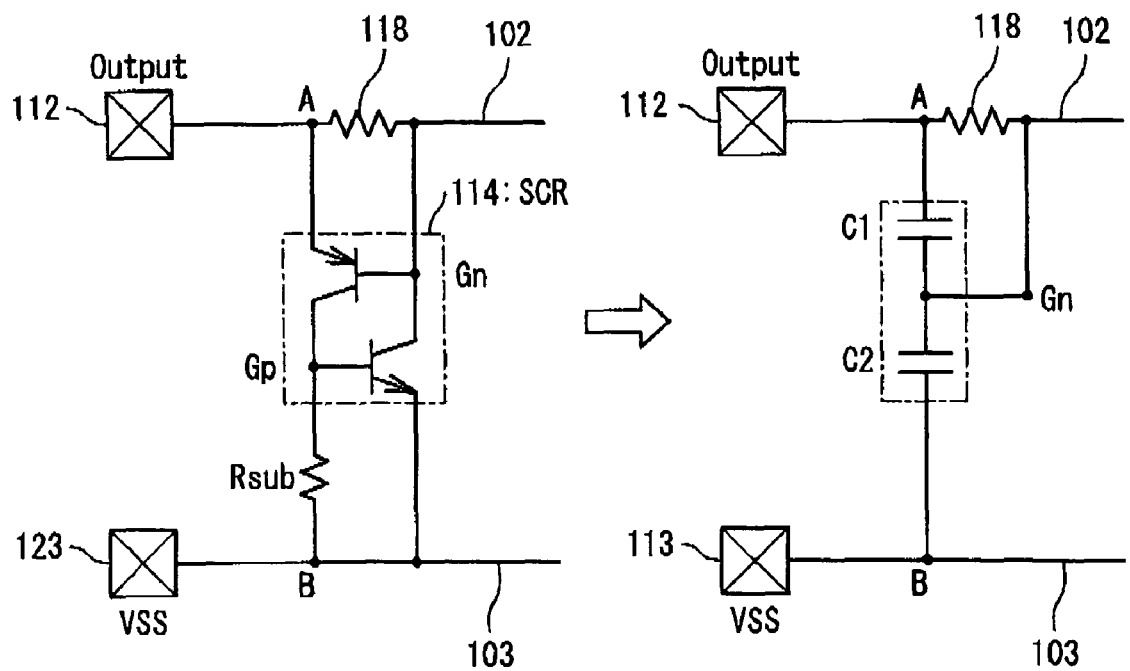
FIGS. 4A and 4B are equivalent circuit diagrams of the semiconductor integrated circuit in FIG. 2.
Figure 5:
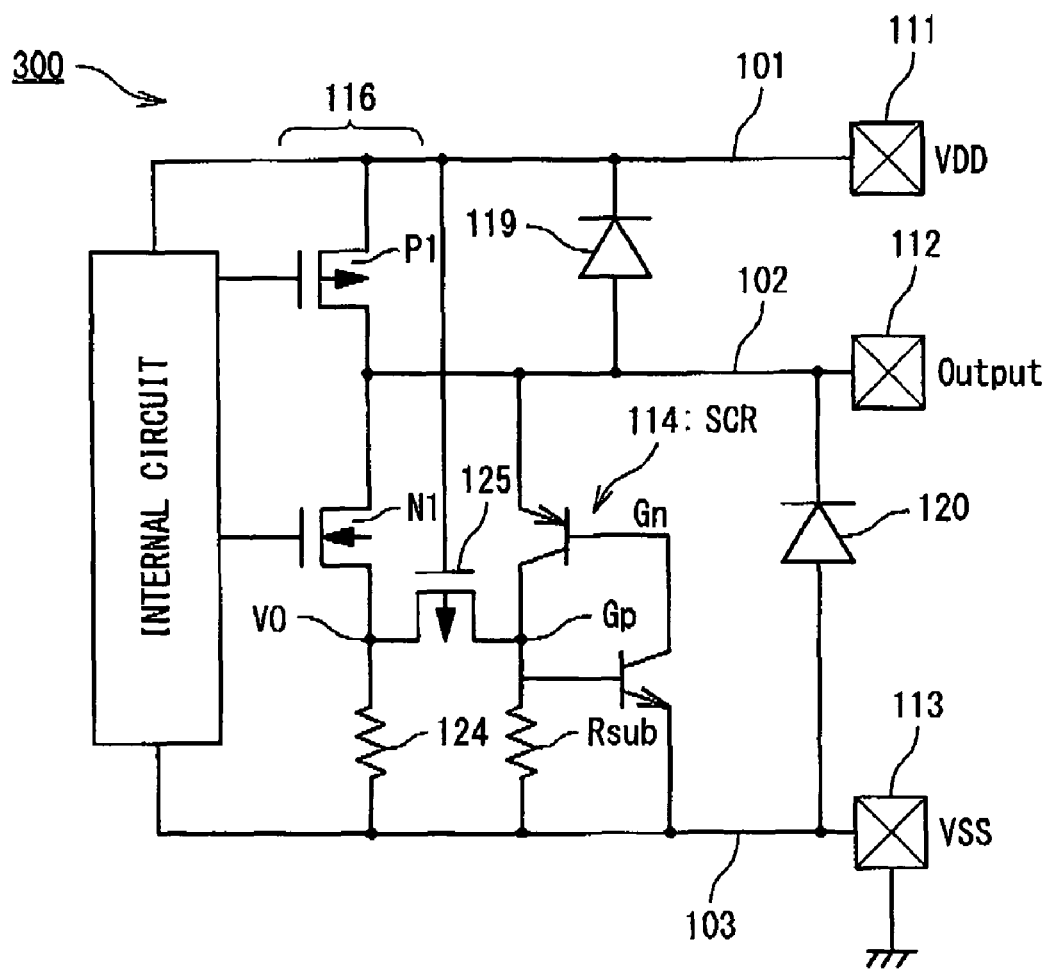
FIG. 5 is a circuit diagram showing a configuration of another conventional semiconductor integrated circuit including a thyristor as the ESD protection device.
Figure 6B:
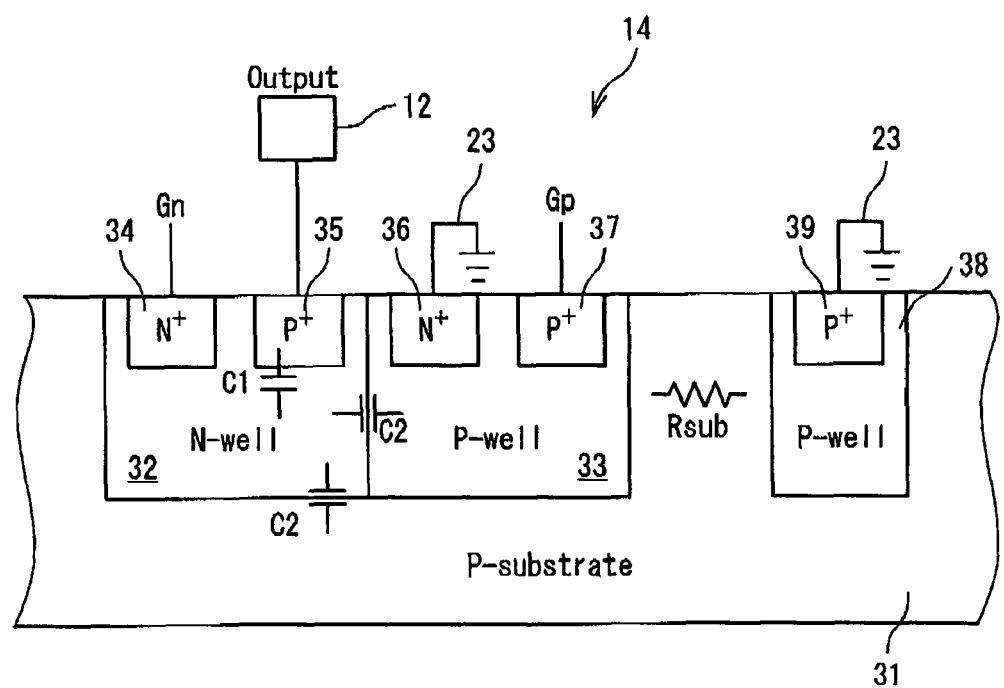
FIG. 6B is a sectional view showing a configuration of a thyristor in a semiconductor integrated circuit in the first embodiment.

FIG. 6B is a sectional view showing a configuration of the thyristor 14. As shown in FIG. 6B, the thyristor 14 has a same configuration as the thyristor 14 shown in FIG. 3. An N well 32 and a P well 33 are formed in a P-type substrate 31 to be adjacent to each other. An $N^+$ region 34 and a $P^+$ region 35 are formed in the N well 32, and the $N^+$ region 34 functions as an N gate Gn and the $P^+$ region 35 functions as an anode. The $P^+$ region 35 (that is, anode) is connected to the output pad 12. Furthermore, an $N^+$ region 36 and a $P^+$ region 37 are formed in the P well 33, and the $N^+$ region 36 functions as a cathode and the $P^+$ region 37 functions as a P gate Gp. The $N^+$ region 36 (that is, cathode) is connected to the ground line 23. A P well 38 is connected to the P-type substrate 31 and a $P^+$ region 39 connected to the ground line 23 is formed in the P well 38. A portion between the P wells 33 and 38 in the P-type substrate 31 serves as a substrate resistance Rsub for biasing the P gate Gp. In FIG. 6B, a junction capacitance formed between the N well 32 and the $P^+$ region 35 is shown as C1 and a junction capacitance formed between the N well 32 and the P well 33 is shown as C2.

In the semiconductor integrated circuit 10 in the present embodiment, a resistance element Rn is connected to the node A which is connected to the source of the NMOS transistor N1, and the ground line 23, and an NMOS transistor N3 is connected to the thyristor 14. As described later, the resistance element Rn is used to detect a current flowing through the NMOS transistor N1 as the protection target device. The NMOS transistor N3 is used as a trigger device for generating a trigger to operate the thyristor 14. The NMOS transistor N3 is connected to the N gate Gn of the thyristor 14 at its drain, is connected to the ground line 23 at its source and is connected to the node A at its gate. The NMOS transistor N3 detects a voltage generated in the resistance element Rn and operates in response to the voltage generated in the resistance element Rn.

An operation of the semiconductor integrated circuit 10, especially, the NMOS transistor N3 and the thyristor 14 in the present embodiment will be described. When the ESD surge of positive polarity to the VSS pad 13 is applied to output pad 12, a current may flow through the NMOS transistor N1. In this case, the current also flows through the resistance element Rn to increase a voltage at the node A. Thus, a gate-source voltage of the NMOS transistor N3 increases, so that the NMOS transistor N3 is turned on. Then, the NMOS transistor N3 generates a trigger to activate the thyristor 14. In this example, the NMOS transistor N3 pulls a current from the N gate Gn to activate the thyristor 14. Once the thyristor 14 is activated, the voltage of the output pad 12 is kept low until the surge current stops flowing. Thus, no current flows through the NMOS transistor N1, to prevent breakdown of the NMOS transistor N1.

Even when no current flows into the NMOS transistor N1, the NMOS transistor N3 serves as a transistor in an off state, a gate of which is grounded. Accordingly, the parasitic bipolar transistor is turned on in response to a snap-back operation of the NMOS transistor N3, thereby activating the thyristor 14.

Since the semiconductor integrated circuit 10 in the present embodiment is configured so that the voltage generated in the resistance element Rn is detected by the gate of the NMOS transistor N3, the thyristor 14 can be reliably activated depending on the current flowing through the NMOS transistor N1, even if the resistance element Rn is small. For example, it is assumed that the resistance element Rn is a resistance of 1Ω formed from a metal wiring resistance and the current of 300 mA, which does not to cause breakdown of the NMOS transistor N1, flows through the NMOS transistor N1. Also, in this case, since the voltage of the node A increases to 0.3V, a trigger can be generated to activate the thyristor 14, if a threshold voltage Vt of the NMOS transistor N3 is 0.3V.

Figure 7:
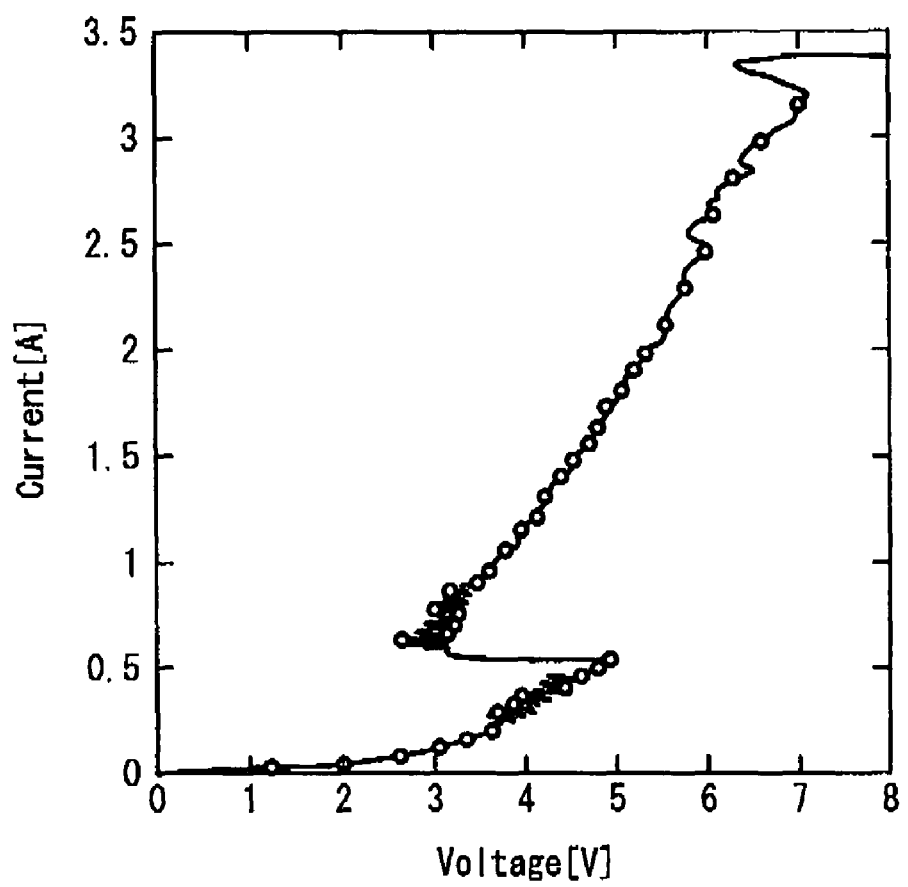
FIG. 7 is a graph showing an operation of the semiconductor integrated circuit in the first embodiment.

FIG. 7 is a graph showing an operation of the semiconductor integrated Circuit 10 in the present embodiment. A horizontal axis represents a voltage applied to the output pad 12 and a vertical axis represents a current flowing into the output pad 12. In the operation shown in FIG. 7, when the voltage of 5V is applied and the current of about 500 mA flows through the NMOS transistor N1, the thyristor 14 operates and the NMOS transistor N1 is effectively protected.

Figure 8A:
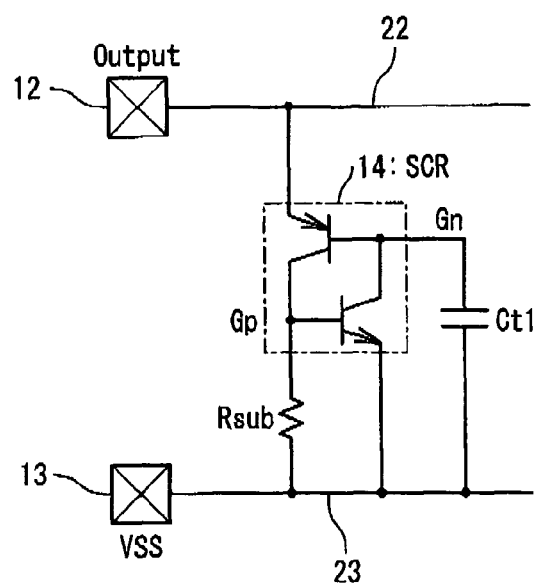
FIGS. 8A and 8B are circuit diagrams showing an equivalent circuit of the thyristor and an NMOS transistor N3 in the semiconductor integrated circuit in the first embodiment.
Figure 8B:
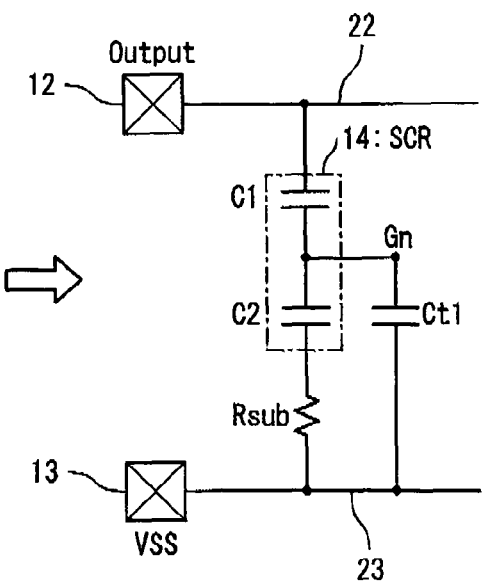

In addition, in the semiconductor integrated circuit 10 in the present embodiment, since the NMOS transistor N3 is connected between the N gate Gn of the thyristor 14 and the ground line 23 and the N gate Gn is electrically isolated from the output pad 12, an output capacitance can be decreased. FIGS. 8A and 8B are diagrams showing an equivalent circuit of the thyristor 14 and the NMOS transistor N3. In the present embodiment, since the NMOS transistor N3 is connected between the N gate Gn of the thyristor 14 and the ground line 23, the output capacitance $C_{total}$ of the output pad 12 corresponds to a synthetic capacitance obtained by serially connecting a parallel-connected capacitance of the capacitance C2 formed between the N well 32 and the P well 33 and a capacitance Ct1 of the NMOS transistor N3 to a capacitance C1 formed in the PN junction between the N well 32 and the P+ region 35. That is, $$C_{total} = C1 // (C2 + Ct1),$$

Here, "//" is a symbol representing a synthetic capacitance of serially connected capacitances. When the capacitance C1 is made very small, the output capacitance $C_{total}$ of the output pad 12 approximately corresponds to the capacitance C1. That is, $C_{total} \approx C1$.

It should be noted that the capacitance C1 can be easily made small by reducing the area of the PN junction between the N well 32 and the P+ region 35. In other words, in the semiconductor integrated circuit 10 in the present embodiment, reduction in the output capacitance $C_{total}$ of the output pad 12 can be achieved. Thus, the feature of reduction in the output capacitance $C_{total}$ of the output pad 12 by use of the thyristor 14 is impaired.

As described above, the semiconductor integrated circuit 10 in the present embodiment can both achieve reduction in the resistance value of the path to which the output signal is outputted and increase reliability in triggering of the ESD protection target element while having a low output capacitance.

[Second Embodiment]

Figure 9:
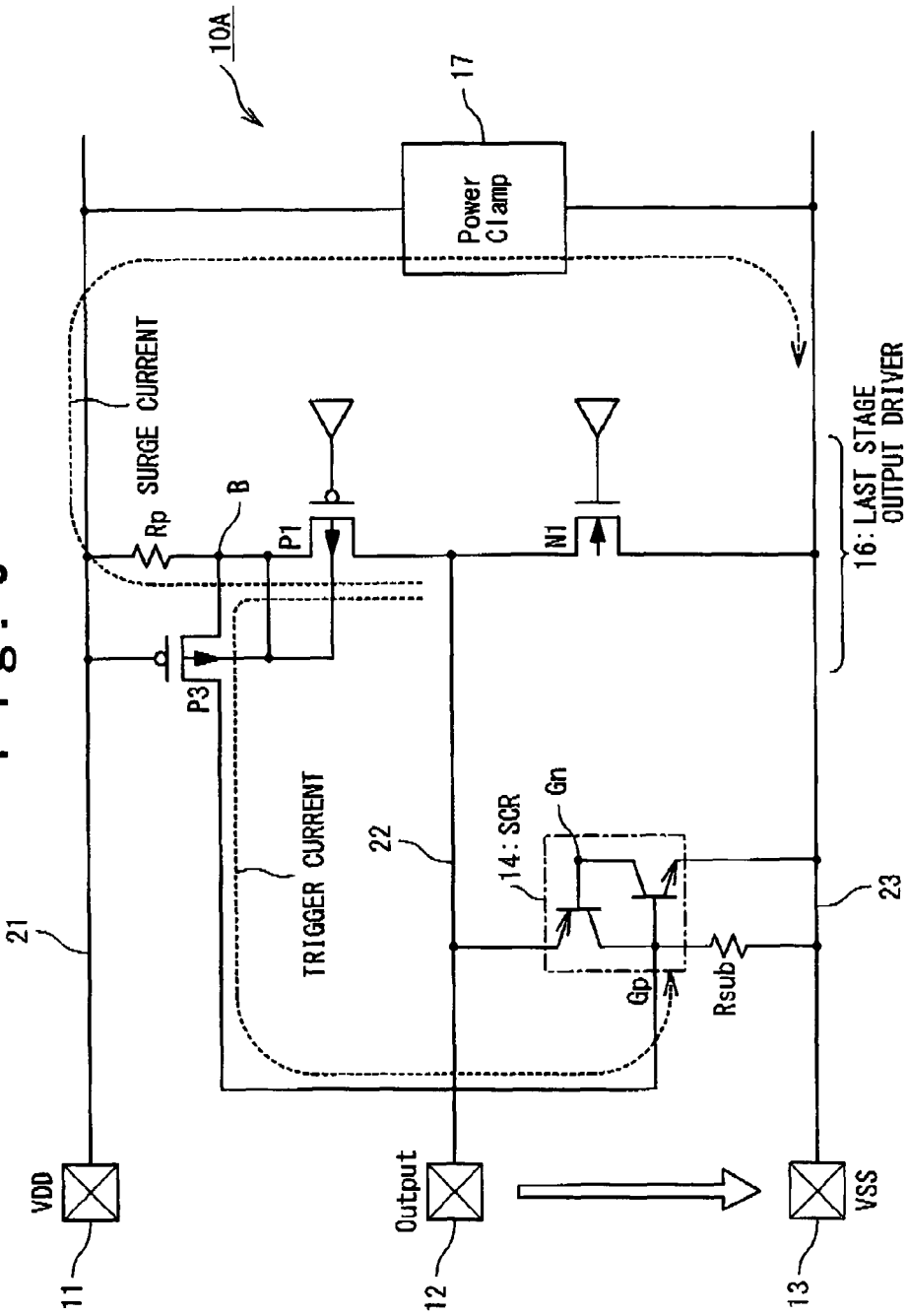
FIG. 9 is a circuit diagram showing the configuration of the semiconductor integrated circuit according to a second embodiment of the present invention.

FIG. 9 is a circuit diagram showing the configuration of a semiconductor integrated circuit 10A according to a second embodiment of the present invention. The semiconductor integrated circuit 10A of the second embodiment has the configuration for protecting the PMOS transistor P1 of the last stage output driver 16 from the electrostatic breakdown. In detail, a resistance element Rp is connected between the power supply line 21 and a node B and the PMOS transistor P1 is connected between the node B and the output signal line 22. The resistance element Rp is used to detect a current flowing through the PMOS transistor P1 as a protection target device. The PMOS transistor P3 used as a trigger device is connected to the P gate Gp of the thyristor 14. The PMOS transistor P3 is connected to the P gate Gp of the thyristor 14 at its drain, is connected to the node B at its source and is connected to the power supply line 21 at its gate. A power clamp 17 is connected between the power supply line 21 and the ground line 23.

An operation of the semiconductor integrated circuit 10A, in particular, the PMOS transistor P3 and the thyristor 14 in the present embodiment will be described below.

When the ESD surge of positive polarity to the VSS pad 13 is applied to output pad 12 and surge current flows through the PMOS transistor P1 and the power clamp 17, the voltage of the power supply line 21 becomes lower than the voltage of the node B due to voltage drop of the resistance element Rp. Then, the gate voltage of the PMOS transistor P3 becomes lower than the source voltage of the PMOS transistor P3, so as to turn on the PMOS transistor P3. Thus, the PMOS transistor P3 generates a trigger for activating the thyristor 14. In the present embodiment, the PMOS transistor P3 supplies the current and activates the thyristor 14. Once the thyristor 14 is activated, the voltage of the output pad 12 is kept low until the surge current stops flowing. In this way, no current flows through the PMOS transistor P1, to prevent breakdown of the PMOS transistor P1.

Since the semiconductor integrated circuit 10A in the second embodiment is configured so that a voltage applied to the resistance element Rp is detected by the gate of the PMOS transistor P3, even if the resistance element Rp is small, the thyristor 14 can be reliably activated depending on the current flowing through the PMOS transistor P1. In addition, since the N gate Gn and the P gate Gp of the thyristor 14 are electrically isolated from the output pad 12, an output capacitance of the output pad 12 can be decreased.

[Third Embodiment]

Figure 10:
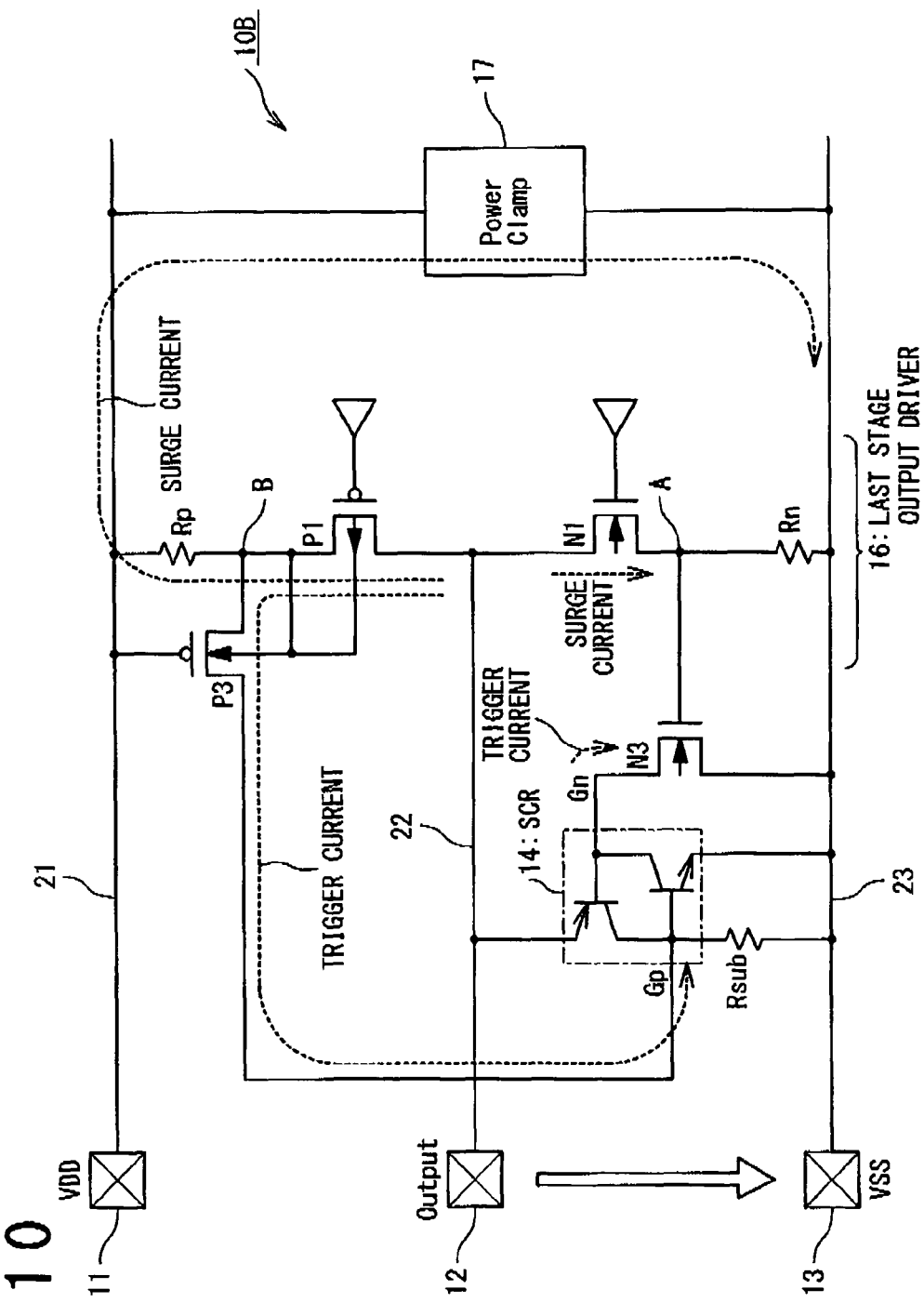
FIG. 10 is a circuit diagram showing the configuration of the semiconductor integrated circuit according to a third embodiment of the present invention.

FIG. 10 is a circuit diagram showing the configuration of a semiconductor integrated circuit 10B according to a third embodiment of the present invention. The semiconductor integrated circuit 10B in the third embodiment has the configuration of a combination of the semiconductor integrated circuits 10 and 10A in the first and second embodiments, for protecting both of the NMOS transistor N1 and the PMOS transistor P1 against electrostatic breakdown. In detail, the resistance element Rn is connected between the ground line 23 and the node A and the NMOS transistor N1 is connected between the node A and the output signal line 22. The gate of the NMOS transistor N3 used as the trigger device is connected to the node A. The NMOS transistor N3 is connected to the N gate Gn of the thyristor 14 at its drain, and is connected to the ground line 23 at its source. Furthermore, the resistance element Rp is connected between the power supply line 21 and the node B and the PMOS transistor P1 is connected between the node B and the output signal line 22. A source of the PMOS transistor P3 used as the trigger device is connected to the node B. The PMOS transistor P3 is connected to the P gate Gp of the thyristor 14 at its drain and is connected to the power supply line 21 at its gate. The power clamp 17 is connected between the power supply line 21 and the ground line 23. To reduce a layout area, it is preferred that the PMOS transistors P1, P3 are formed in a same N well. In this case, the NMOS transistors N1 and N3 are formed in the P well, it is preferred that the NMOS transistors N1 and N3 are formed in a same P well for the same reason.

An operation at the time when the surge current flows through the NMOS transistor N1 is the same as in the semiconductor integrated circuit 10 in the first embodiment. An operation at the time when the surge current flows through the PMOS transistor P1 is the same as in the semiconductor integrated circuit 10A in the first embodiment. With the configuration in the third embodiment, the thyristor 14 can be activated before the current flows through either the NMOS transistor N1 or the PMOS transistor P1, and both of the NMOS transistor N1 and the PMOS transistor P1 are subjected to breakdown. Furthermore, by triggering both the P gate Gp and the N gate Gn of the thyristor 14, the thyristor 14 can be activated at higher speed.

[Fourth Embodiment]

Figure 11:
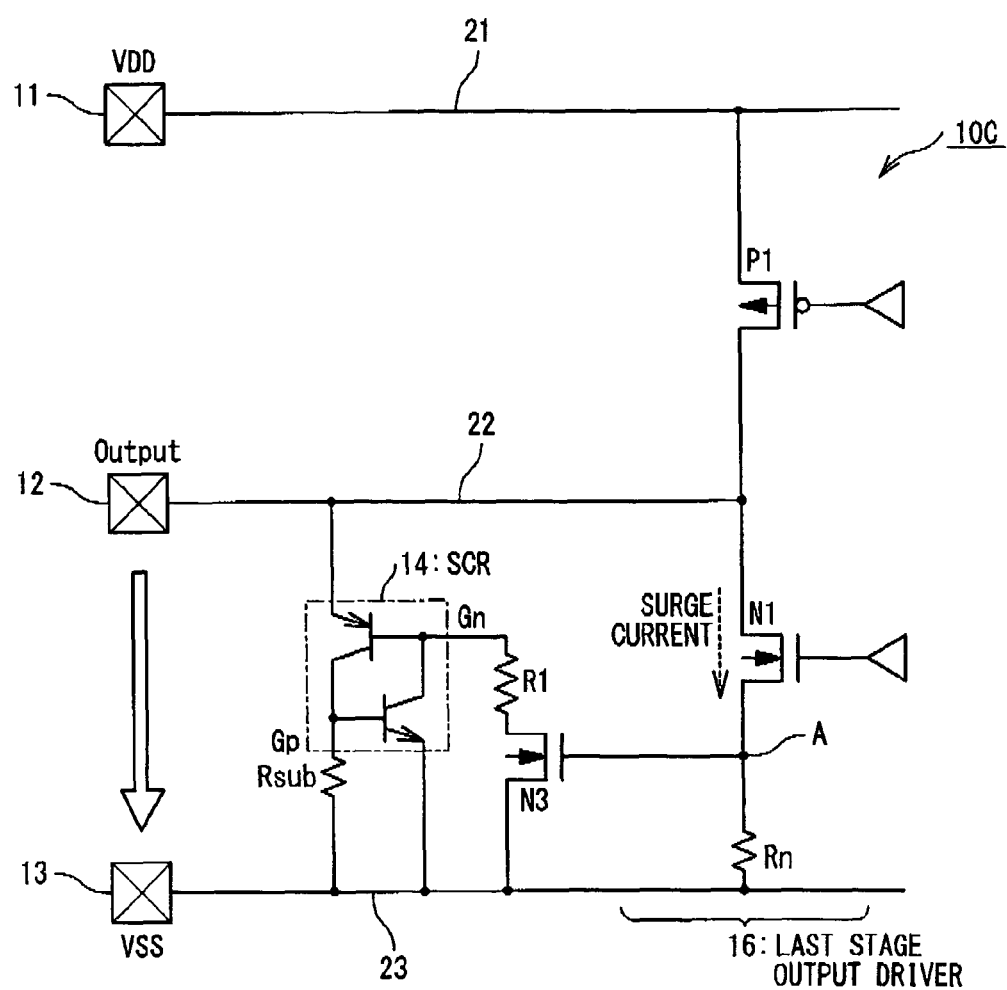
FIG. 11 is a circuit diagram showing the configuration of the semiconductor integrated circuit according to a fourth embodiment of the present invention.

FIG. 11 is a circuit diagram showing the configuration of a semiconductor integrated circuit 10C according to a fourth embodiment of the present invention. In the fourth embodiment, a current limiting resistance R1 is serially connected to the NMOS transistor N3 used as the trigger device. The current limiting resistance R1 prevents an excessive current from flowing through the NMOS transistor N3 after the thyristor 14 starts to operate, so that the NMOS transistor N3 is subjected to breakdown. Although the current limiting resistance R1 is introduced between the drain of the NMOS transistor N3 and the N gate Gn of the thyristor 14 in the circuit shown in FIG. 11, the current limiting resistance R1 may be connected between the source of the NMOS transistor N3 and the ground line 23.

Similarly, in the semiconductor integrated circuits 10A and 10B shown in FIGS. 9 and 10, the current limiting resistance may be serially connected to the PMOS transistor P3. The current limiting resistance may be connected between the drain of the PMOS transistor P3 and the P gate Gp of the thyristor 14, and between the source of the PMOS transistor P3 and the node B.

[Fifth Embodiment]

Figure 12:
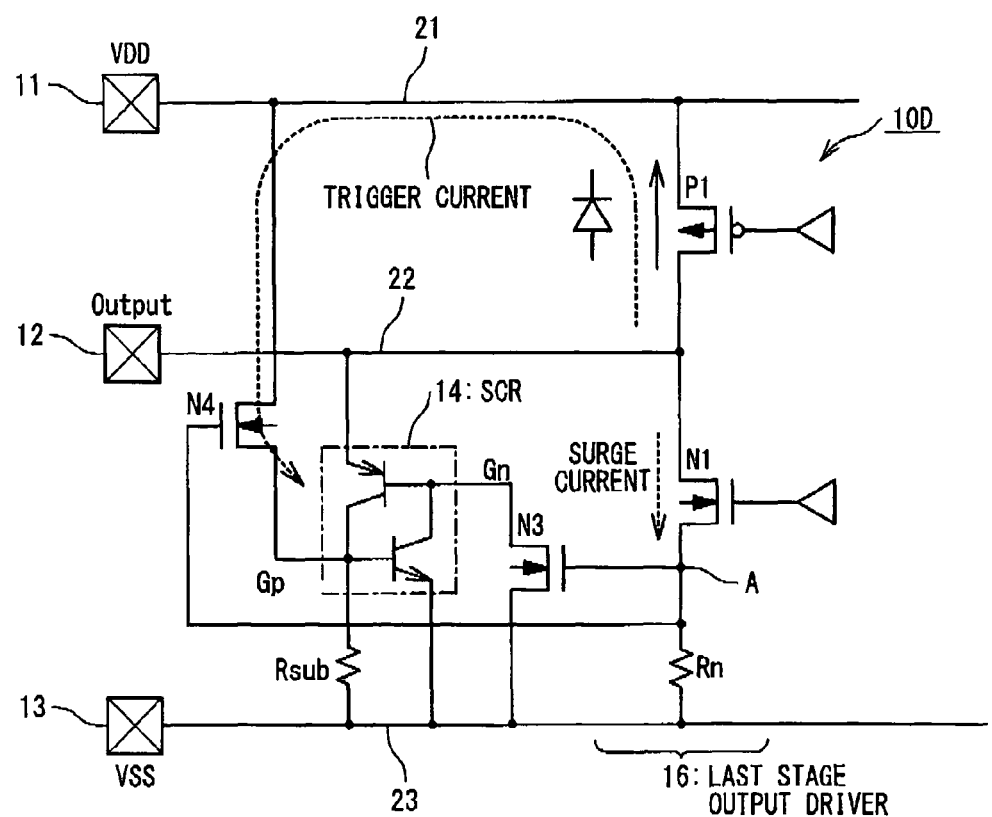
FIG. 12 is a circuit diagram showing the configuration of the semiconductor integrated circuit according to a fifth embodiment of the present invention.

FIG. 12 is a circuit diagram showing the configuration of a semiconductor integrated circuit 10D according to a fifth embodiment of the present invention. The semiconductor integrated circuit 10D in the fifth embodiment supplies triggers to the N gate Gn of the thyristor 14 from the NMOS transistor N3 and to the P gate Gn from the NMOS transistor N4. In detail, the NMOS transistor N4 is connected to the P gate Gp of the thyristor 14 at its source, is connected to the power supply line 21 at its drain and is connected to the node A at its gate.

Both of the NMOS transistors N3 and N4 detect the voltage of the node A (that is, a connection node between the resistance element Rn and the source of the NMOS transistor N1) and generate the trigger. By supplying trigger to both of the N gate Gn and the P gate Gp of the thyristor 14, the thyristor 14 can be triggered at high speed. A trigger current supplied to the P gate Gp flows from the output pad 12 through the NMOS transistor N4 via a parasitic diode formed of the drain of the PMOS transistor P1 of the output driver 16 and the N well, and reaches P gate Gp.

[Sixth Embodiment]

Figure 13A:
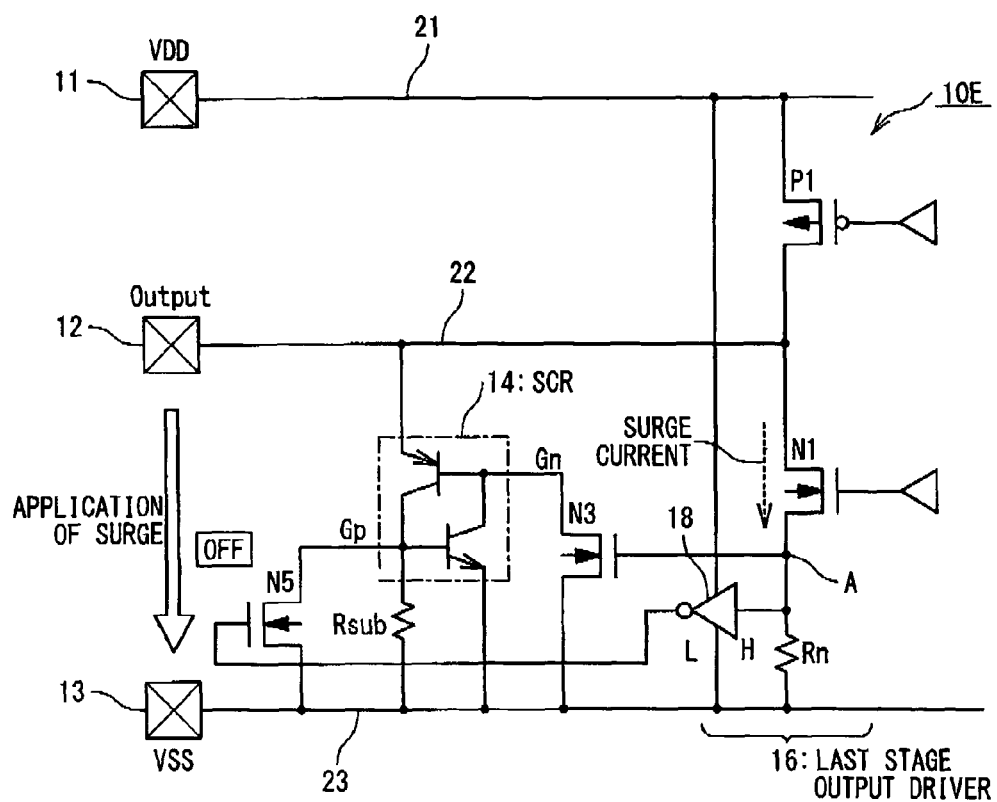
FIGS. 13A and 13B are circuit diagrams showing the configuration of the semiconductor integrated circuit according to a sixth embodiment of the present invention.
Figure 13B:
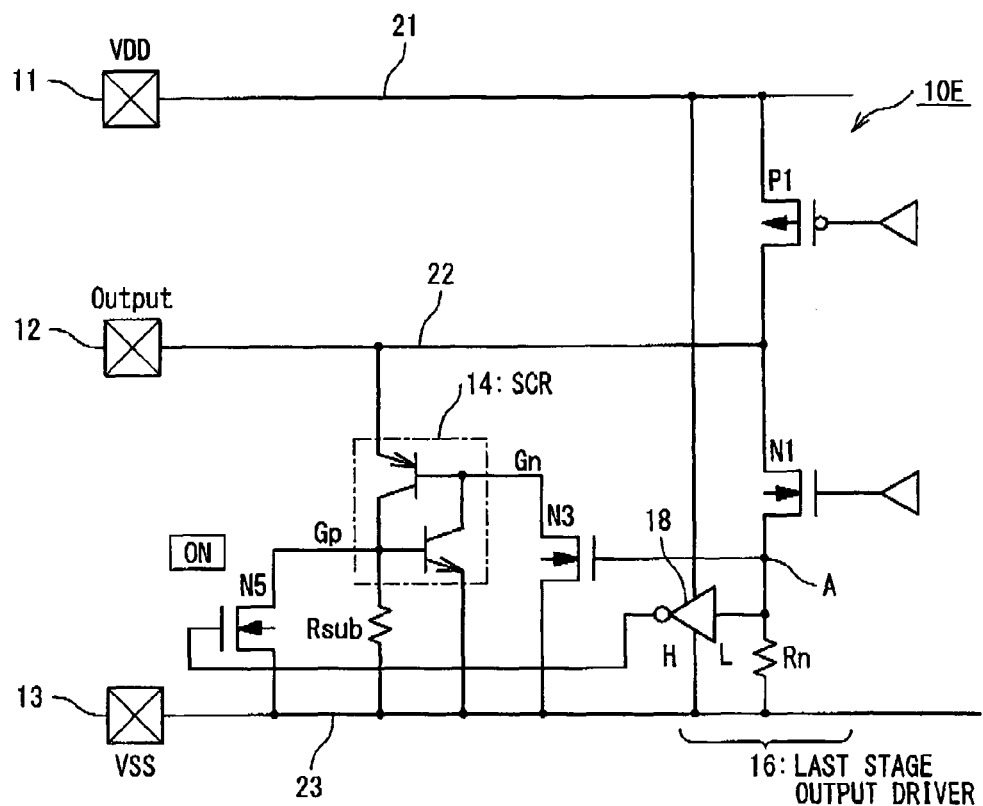

FIGS. 13A and 13B are circuit diagrams showing the configuration of a semiconductor integrated circuit 10E of a sixth embodiment of the present invention. A configuration of the semiconductor integrated circuit 10E in the present embodiment contributes to effectively restrict latch-up of the thyristor 14 while increasing the discharge capacity of the thyristor 14. The discharge capacity of the thyristor 14 depends on base resistance of an NPN bipolar transistor of the thyristor 14. That is, when the thyristor 14 has the configuration shown in FIG. 6B, the substrate resistance Rsub between the P wells 33 and 38 of the P-type substrate 31 corresponds to a base resistance of the NPN bipolar transistor. When the substrate resistance Rsub is large, the performance of the NPN bipolar transistor of the thyristor 14 is improved to increase the discharge capacity of the thyristor 14, which is advantageous for electrostatic protection. However, when the substrate resistance Rsub increases, latch-up can occur in the normal operation.

In the semiconductor integrated circuit 10E in the sixth embodiment, by providing an inverter 18 and an NMOS transistor N5, both of improvement in the discharge capacity of the thyristor 14 and prevention of latch-up of the thyristor 14 are achieved. In response to the voltage at the node A, the inverter 18 controls on/off of the NMOS transistor N5. In detail, an input terminal of the inverter 18 is connected to the node A and an output terminal of the inverter 18 is connected to the gate of the NMOS transistor N5. A power supply terminal of the inverter 18 is connected to the power supply line 21 and the ground terminal is connected to the ground line 23. The NMOS transistor N5 is a switch element which electrically connect/separate the P gate Gp of the thyristor 114 to/from the ground line 23 in response to the output signal of the inverter 18. The NMOS transistor N5 is connected to the P gate Gp of the thyristor 114 at its drain and is connected to the ground line 23 at its source. A threshold voltage of the inverter 18 (that is, the voltage at the output signal of the inverter 18 is switched between High and Low) is set to be approximately same as the threshold voltage of the NMOS transistor N3. The ON-resistance of the NMOS transistor N5 is set to be smaller than the substrate resistance Rsub.

FIG. 13A shows an operation of the semiconductor integrated circuit 10E at the time when the ESD surge is applied to the output pad 12 and FIG. 13B shows an operation of the semiconductor integrated circuit 10E in the normal operation. Referring to FIG. 13A, when the ESD surge is applied to the output pad 12 so that current flows through the resistance element Rn (and the NMOS transistor N1), the voltage of the node A increases. At this time, the output signal of the inverter 18 is pulled down to a "Low" level and the NMOS transistor N5 is turned off. In this case, the substrate resistance Rsub serves as a base resistance of the NPN transistor of the thyristor 14. As described above, when the substrate resistance Rsub is increased, the discharge capacity of the thyristor 14 is improved.

With the configuration of the semiconductor integrated circuit 10E in the present embodiment, even when the substrate resistance Rsub is increased, latch-up is hard to occur in the normal operation. Referring to FIG. 13B, in the normal operation, the output signal of the inverter 18 is pulled up to a "High" level and the NMOS transistor N5 is turned on. Since the ON-resistance of the NMOS transistor N5 is smaller than the substrate resistance Rsub, when the NMOS transistor N5 is turned on, the base resistance of the NPN transistor of the thyristor 14 becomes small. For this reason, latch-up is prevented from occurring in the normal operation.

[Seventh Embodiment]

Figure 14:
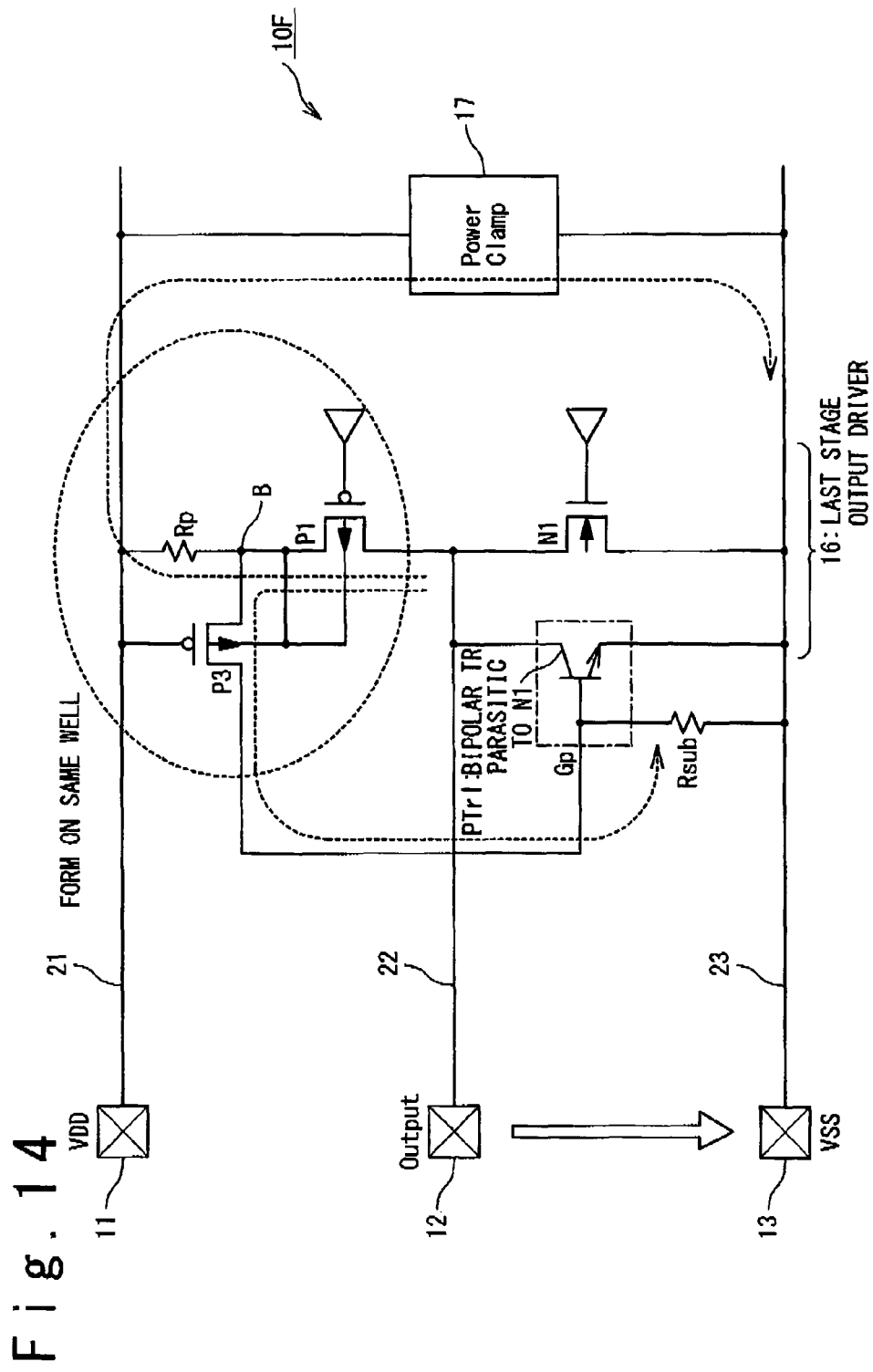
FIG. 14 is a circuit diagram showing the configuration of the semiconductor integrated circuit according to a seventh embodiment of the present invention.

FIG. 14 is a circuit diagram showing the configuration of a semiconductor integrated circuit 10F according to a seventh embodiment of the present invention. One feature of the semiconductor integrated circuit 10F in the present embodiment is that a parasitic bipolar transistor of the MOS transistor is used as the ESD protection device. In the semiconductor integrated circuit 10F in the present embodiment, a parasitic NPN transistor PTr1 of the NMOS transistor N1 of the last stage output driver 16 is used as the ESD protection device. The semiconductor integrated circuit 10F in the seventh embodiment will be described in detail below.

The semiconductor integrated circuit 10F in the present embodiment has the configuration that the PMOS transistor P1 of the last stage output driver 16 is protected against the ESD surge. To detect a current flowing through the PMOS transistor P1, the resistance element Rp is connected between the source of the PMOS transistor P1 and the power supply line 21. A PMOS transistor P3 is used as the trigger device. To reduce a layout area, it is preferred that the PMOS transistors P1 and P3 are formed on a same N well. The PMOS transistor P3 is connected to the node B at its source, is connected to the power supply line 21 at its gate and is connected to a back gate of the NMOS transistor N1 (that is, the $P^+$ region formed in the P well on which the NMOS transistor N1 is formed) at its drain. It should be noted that the back gate of the NMOS transistor N1 serves as a base of the parasitic NPN transistor. The P well and the $P^+$ region for grounding the P-type substrate on which the NMOS transistor N1 is formed are formed independent of the back gate of the NMOS transistor N1. The substrate resistance Rsub in FIG. 14 is accomplished in the semiconductor integrated circuit 10F as a resistance of the P-type substrate 31.

An operation of the semiconductor integrated circuit 10F in the seventh embodiment will be described below. When the ESD surge of positive polarity to the VSS pad 13 is applied to the output pad 12 so that a surge current flows through the PMOS transistor P1 and the power clamp 17, the voltage of the power supply line 21 becomes lower than the voltage of the node B due to a voltage drop of the resistance element Rp. Then, the gate voltage of the PMOS transistor P3 becomes lower than the source voltage of the PMOS transistor P3, thereby turning on the PMOS transistor P3. Also, the PMOS transistor P3 generates a trigger for activating the parasitic NPN transistor PTr1. In the present embodiment, the PMOS transistor P3 supplies a current to the base Gp of the parasitic NPN transistor PTr1 and activates the parasitic NPN transistor PTr1. Once the parasitic NPN transistor PTr1 is activated, no current flows through the PMOS transistor P1 to prevent breakdown of the PMOS transistor P1, since the voltage of the output pad 12 is kept low until the surge current ends flowing.

From the above-mentioned description, those skilled in the art could easily understand that a bipolar element (including the parasitic bipolar transistor of the MOS transistor) can be used as the ESD protection device in place of the thyristor. For example, a normal NPN bipolar transistor can be used in place of the parasitic NPN transistor PTr1 of the NMOS transistor N1.

[Eighth Embodiment]

Figure 15:
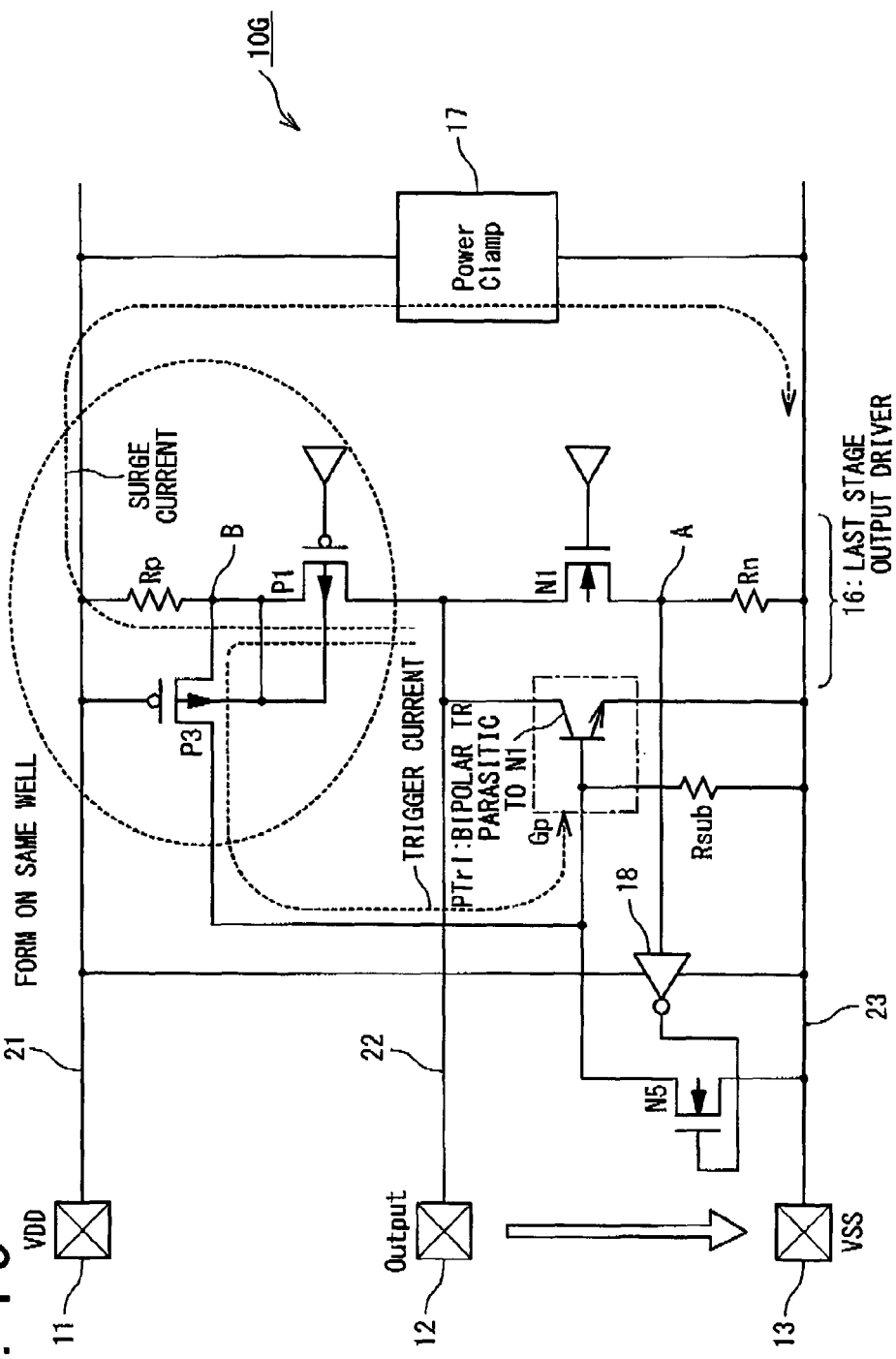
FIG. 15 is a circuit diagram showing the configuration of the semiconductor integrated circuit according to an eighth embodiment of the present invention.

FIG. 15 is a circuit diagram showing the configuration of a semiconductor integrated circuit 10G according to an eighth embodiment of the present invention. In the eighth embodiment, the circuit configuration which can achieve both of high discharge capacity and restriction of latch-up as in the sixth embodiment is applied to the semiconductor integrated circuit 10F in the seventh embodiment.

More specifically, in the eighth embodiment, the inverter 18 and the NMOS transistor N5 are added. The input terminal of the inverter 18 is connected to the node A and the output terminal of the inverter 18 is connected to the gate of the NMOS transistor N5. The power supply terminal of the inverter 18 is connected to the power supply line 21 and the ground terminal of the inverter 18 is connected to the ground line 23. The NMOS transistor N5 is connected to the back gate of the NMOS transistor N1 (that is, the base of the parasitic NPN transistor PTr1) at its drain and is connected to the ground line 23, at its source. The threshold voltage (that is, a voltage at which an output signal of the inverter 18 is switched between High and Low) of the inverter 18 is set to be approximately same as the threshold voltage of the PMOS transistor P3. The ON-resistance of the NMOS transistor N5 is set to be smaller than the substrate resistance Rsub.

When the ESD surge is applied to the output pad 12 so that a current flows through the resistance element Rn (and the NMOS transistor N1), a voltage at the node A increases. In response to the increase in the voltage of the node A, the output signal of the inverter 18 is pulled down to a "low" level and the NMOS transistor N5 is turned off. In this case, the substrate resistance Rsub functions as a base resistance of the parasitic NPN transistor. Those skilled in the art could understand that when the substrate resistance Rsub is increased, a discharge capacity of the parasitic NPN transistor is improved. On the other hand, in the normal operation, the output signal of the inverter 18 is pulled up to a "high" level and the NMOS transistor N5 is turned on. Since the ON-resistance of the NMOS transistor N5 is smaller than the substrate resistance Rsub when the NMOS transistor N5 is turned on, the base resistance of the parasitic NPN transistor becomes small. For this reason, latch-up is prevented from occurring in the normal operation.

Figure 16:
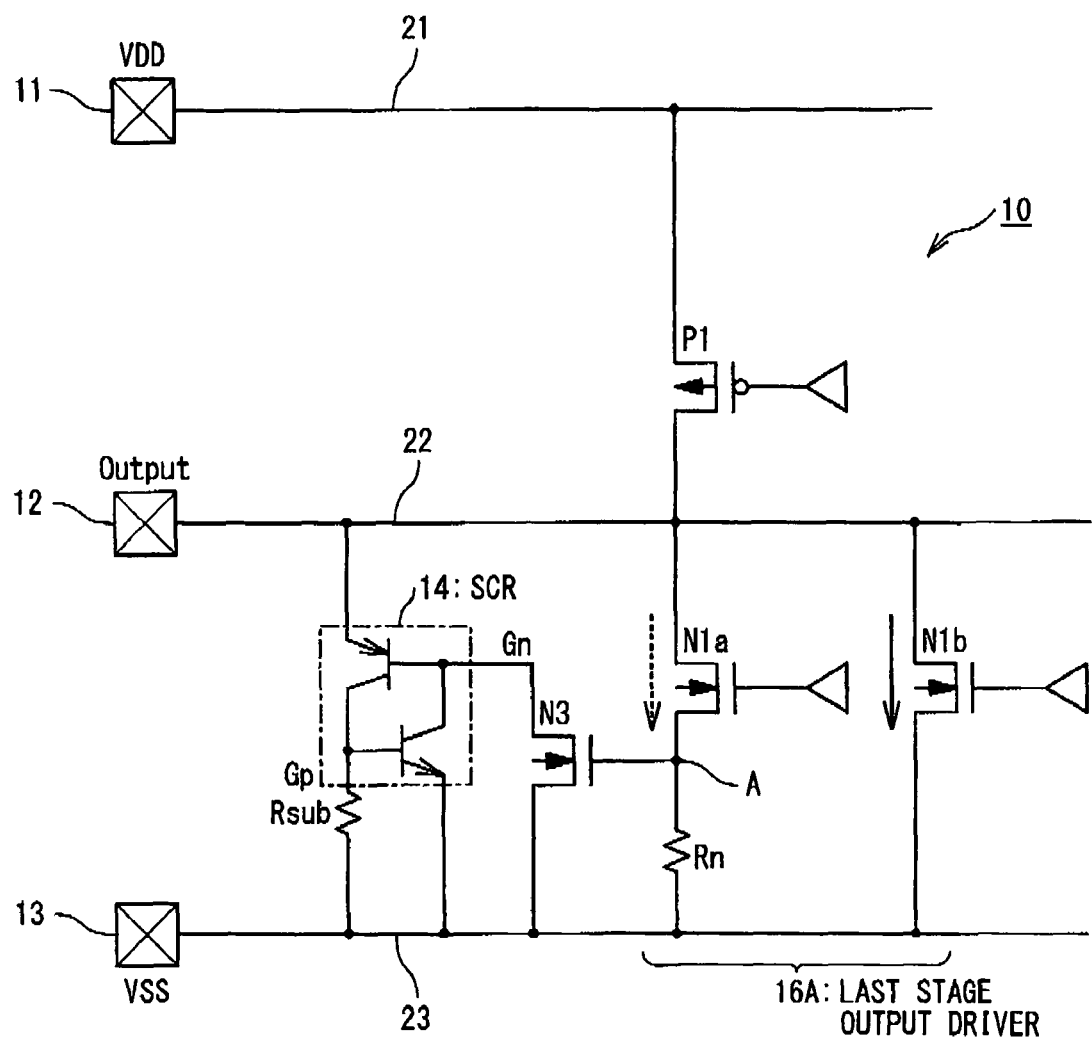
FIG. 16 is a circuit diagram showing a modified example of the semiconductor integrated circuit of the first embodiment of the present invention.

It should be noted that the present invention is not limited to the above-mentioned embodiments and various modifications can be made. Furthermore, especially when a plurality of protection target devices exist, the resistance element Rn or Rp need not be provided for each protection target device. For example, when the protection target devices are the NMOS transistors N1a and N1b as shown in FIG. 16, the resistance element Rn can be connected to only the NMOS transistor N1a and no resistance for detecting a current is connected to the NMOS transistor N1b. Even with such configuration, the NMOS transistors N1a and N1b are effectively protected against ESD surge.

In the present embodiment, although the output pad 12 is used as an output of the output signal, the pad 12 can be also used as an input of the signal. In this case, the pad 12 is connected to an input buffer provided separately from the last stage output driver 16 and serves as an I/O pad.

Note that, in the above-mentioned embodiments, a plurality of operations can be combined as long as the operations do not conflict.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor integrated circuit comprising:
an output pad from which an output signal is outputted;
an output signal line connected with said output pad;
a first pad configured to function as a ground terminal or a power supply terminal;
a first wiring connected with said first pad;
an output driver connected with said output pad and configured to generate said output signal;
an ESD (electrostatic discharge) protection device connected with said output signal line and having a function to discharge surge applied to said output pad;
a first trigger MOS (metal-oxide semiconductor) transistor used as a trigger device;
a first protection target device connected between said output signal line and a first interconnection;
a first resistance element connected between a gate and a source of said first trigger MOS transistor; and
a switching device,
wherein a current flowing through said first protection target device is detected by use of said first resistance element,
wherein said ESD protection device comprises a bipolar transistor,
wherein said first pad comprises a VSS pad configured to function as a ground terminal,
wherein said first interconnection comprises a ground interconnection, and
wherein said switching device is connected between said ground interconnection and a base of said bipolar transistor, and is turned on or off in response to the voltage generated in said first resistance element.

2. The semiconductor integrated circuit according to claim 1, wherein said first trigger MOS transistor comprises an NMOS (n channel MOS) transistor, and
wherein said first trigger MOS transistor is connected between an N gate and said ground line of said thyristor.

3. The semiconductor integrated circuit according to claim 2, wherein said first protection target device comprises a protection target NMOS transistor including a drain connected with said output signal line and a source connected with said first resistance element, and
wherein said first trigger MOS transistor has the drain connected with the N gate of said thyristor, a gate connected with a connection node between said first resistance element and the source of said protection target NMOS transistor, and a source connected to the ground line.

4. The semiconductor integrated circuit according to claim 1, wherein said bipolar transistor comprises a parasitic bipolar transistor which is parasitic to said MOS transistor.

5. The semiconductor integrated circuit according to claim 4, wherein said output driver comprises said MOS transistor.

6. A semiconductor integrated circuit comprising:
an output pad from which an output signal is outputted;
an output signal line connected with said output pad;
a first pad configured to function as a ground terminal or a power supply terminal;
a first wiring connected with said first pad;
an output driver connected with said output pad and configured to generate said output signal;
an ESD (electrostatic discharge) protection device connected with said output signal line and having a function to discharge surge applied to said output pad;
a first trigger MOS (metal-oxide semiconductor) transistor used as a trigger device;
a first protection target device connected between said output signal line and a first interconnection; and
a first resistance element connected between a gate and a source of said first trigger MOS transistor,
wherein a current flowing through said first protection target device is detected by use of said first resistance element,
wherein said ESD protection device comprises a thyristor,
wherein said first trigger MOS transistor comprises an NMOS (n channel MOS) transistor,
wherein said first pad is a VSS pad which functions as a ground terminal,
wherein said first interconnection comprises a ground interconnection,
wherein said first trigger MOS transistor is connected between an N gate and said ground line of said thyristor,
wherein said semiconductor integrated circuit further comprises:
a VDD (voltage-drain-drain, drain supply voltage of positive potential) pad configured to function as a power supply terminal;
a power supply line connected with said VDD pad; and
a second trigger MOS transistor which comprises a PMOS (p channel MOS) transistor,
wherein said output driver comprises:
a second protection target device connected between said output signal line and said power supply line; and
a second resistance element connected between said second protection target device and said power supply line, and
wherein said second trigger MOS transistor detects a voltage generated in said second resistance element by a gate, and makes said ESD protection device operate in response to the detected voltage.

7. A semiconductor integrated circuit comprising:
an output pad from which an output signal is outputted;
an output signal line connected with said output pad;
a first pad configured to function as a ground terminal or a power supply terminal;
a first wiring connected with said first pad;
an output driver connected with said output pad and configured to generate said output signal;
an ESD (electrostatic discharge) protection device connected with said output signal line and having a function to discharge surge applied to said output pad;
a first trigger MOS (metal-oxide semiconductor) transistor used as a trigger device;
a first protection target device connected between said output signal line and a first interconnection; and
a first resistance element connected between a gate and a source of said first trigger MOS transistor,
wherein a current flowing through said first protection target device is detected by use of said first resistance element,
wherein said ESD protection device comprises a thyristor,
wherein said first trigger MOS transistor comprises an NMOS (n channel MOS) transistor,
wherein said first pad is a VSS pad which functions as a ground terminal,
wherein said first interconnection comprises a ground interconnection,
wherein said first trigger MOS transistor is connected between an N gate and said ground line of said thyristor,
wherein said first protection target device comprises a protection target NMOS transistor including a drain connected with said output signal line and a source connected with said first resistance element, and
wherein said first trigger MOS transistor has the drain connected with the N gate of said thyristor, a gate connected with a connection node between said first resistance element and the source of said protection target NMOS transistor, and a source connected to the ground line,
wherein said semiconductor integrated circuit further comprises:
a VDD pad configured to function as a power supply terminal;
a power supply line connected with said VDD pad; and
a second trigger MOS transistor which comprises a PMOS transistor,
wherein said output driver comprises:
a protection target PMOS transistor connected between said output signal line and said power supply line; and
a second resistance element connected in series with said protection target PMOS transistor between said output signal line and said power supply line,
wherein said protection target PMOS transistor has a drain connected with said output signal line and a source connected with said second resistance element,
wherein said second trigger MOS transistor has a drain connected with a P gate of said thyristor, a source connected with a connection node between said second resistance element and the source of said protection target PMOS transistor, and a gate connected with said power supply line.

8. A semiconductor integrated circuit comprising:
an output pad from which an output signal is outputted;
an output signal line connected with said output pad;
a first pad configured to function as a ground terminal or a power supply terminal;
a first wiring connected with said first pad;
an output driver connected with said output pad and configured to generate said output signal;
an ESD (electrostatic discharge) protection device connected with said output signal line and having a function to discharge surge applied to said output pad;

a first trigger MOS (metal-oxide semiconductor) transistor used as a trigger device;
a first protection target device connected between said output signal line and a first interconnection; and
a first resistance element connected between a gate and a source of said first trigger MOS transistor,
wherein a current flowing through said first protection target device is detected by use of said first resistance element,
wherein said ESD protection device comprises a thyristor,
wherein said first trigger MOS transistor comprises an NMOS (n channel MOS) transistor,
wherein said first pad is a VSS pad which functions as a ground terminal,
wherein said first interconnection comprises a ground interconnection,
wherein said first trigger MOS transistor is connected between an N gate and said ground line of said thyristor,
wherein said semiconductor integrated circuit further comprises:
a VDD pad configured to function as the power supply terminal;
a power supply line connected with said VDD pad; and
a second trigger MOS transistor which comprises an NMOS transistor, and
wherein said second trigger MOS transistor is connected between a P gate and said power supply line of said thyristor.

9. The semiconductor integrated circuit according to claim 8, wherein said second trigger MOS transistor has a drain connected with said power supply line, a gate connected with a connection node between said first protection target device and said first resistance element, and a source connected with a P gate of said thyristor.

10. A semiconductor integrated circuit comprising:
an output pad from which an output signal is outputted;
an output signal line connected with said output pad;
a first pad configured to function as a ground terminal or a power supply terminal;
a first wiring connected with said first pad;
an output driver connected with said output pad and configured to generate said output signal;
an ESD (electrostatic discharge)protection device connected with said output signal line and having a function to discharge surge applied to said output pad;
a first trigger MOS (metal-oxide semiconductor) transistor used as a trigger device;
a first protection target device connected between said output signal line and a first interconnection; and
a first resistance element connected between a gate and a source of said first trigger MOS transistor,
wherein a current flowing through said first protection target device is detected by use of said first resistance element,
wherein said ESD protection device comprises a thyristor,
wherein said semiconductor integrated circuit further comprises:
a switching device,
wherein said first pad comprises a VSS (voltage source-source, source or substrate supply voltage of a negative or ground potential) pad configured to function as a ground terminal,
wherein said first interconnection comprises a ground interconnection, and
wherein said switching device is connected between a P gate and said ground interconnection of said thyristor, and is turned on or off in response to the voltage generated in said first resistance element.

* * * * *